(12) United States Patent
Park et al.

(10) Patent No.: US 9,977,712 B2
(45) Date of Patent: May 22, 2018

(54) MEMORY DEVICE WITH DIFFERENT PARITY REGIONS

(71) Applicant: SK hynix Inc., Gyeonggi-do (KR)

(72) Inventors: Min Sang Park, Chungcheongbuk-do (KR); Suk Kwang Park, Chungcheongbuk-do (KR); Yun Bong Lee, Chungcheongbuk-do (KR); Sung Hoon Cho, Gyeonggi-do (KR); Gil Bok Choi, Daejeon (KR)

(73) Assignee: SK Hynix Inc., Gyeonggi-do (KR)

( * ) Notice: Subject to any disclaimer, the term of this patent is extended or adjusted under 35 U.S.C. 154(b) by 12 days.

(21) Appl. No.: 14/966,571

(22) Filed: Dec. 11, 2015

(65) Prior Publication Data
US 2017/0004037 A1    Jan. 5, 2017

(30) Foreign Application Priority Data

Jul. 3, 2015 (KR) ........................ 10-2015-0095391

(51) Int. Cl.
*G06F 11/10* (2006.01)
*G06F 3/06* (2006.01)
*G11C 29/52* (2006.01)
*G11C 29/04* (2006.01)

(52) U.S. Cl.
CPC .......... *G06F 11/1068* (2013.01); *G11C 29/52* (2013.01); *G11C 2029/0411* (2013.01)

(58) Field of Classification Search
CPC .... G06F 11/1068; G06F 3/0688; G06F 3/064; G06F 3/0619; G11C 29/52
See application file for complete search history.

(56) References Cited

U.S. PATENT DOCUMENTS

| | | | | | |
|---|---|---|---|---|---|
| 7,304,893 | B1* | 12/2007 | Hemink | ................. | G11C 16/12 365/185.09 |
| 8,572,311 | B1* | 10/2013 | Shalvi | ..................... | G06F 11/14 711/103 |
| 2008/0002468 | A1* | 1/2008 | Hemink | .............. | G06F 11/1068 365/185.17 |
| 2011/0090734 | A1* | 4/2011 | Burger, Jr. | .......... | G06F 11/1072 365/185.03 |
| 2012/0079351 | A1* | 3/2012 | Cideciyan | ........... | G06F 11/1048 714/764 |
| 2013/0024605 | A1* | 1/2013 | Sharon | ................ | G06F 11/1072 711/103 |
| 2013/0290629 | A1* | 10/2013 | Uehara | ................. | G06F 3/0688 711/114 |

FOREIGN PATENT DOCUMENTS

KR    100644223    11/2006

* cited by examiner

*Primary Examiner* — Kyle Vallecillo
(74) *Attorney, Agent, or Firm* — IP & T Group LLP

(57) ABSTRACT

The present disclosure memory includes a controller for a semiconductor memory device, the device including a memory cell array including a plurality of pages. The controller includes a memory control module suitable for translating a logical address for data provided from a host to a physical address representing one of the plurality of pages, and determining one of a plurality of operation modes based on the physical address and pre-stored parity-related information. The controller further includes and an error correction code circuit suitable for generating parity-data for the data provided from the host according to the determined operation mode.

13 Claims, 6 Drawing Sheets

|  | mode1 | mode2 | mode3 | mode4 |
|---|---|---|---|---|
| Max. fail bit number[bit] | 70 | 80 | 90 | 100 |
| ECC over bits[bit] | 0 | 10 | 20 | 30 |
| Added parity region size[byte] | 0 | 17.5 | 35 | 52.5 |
| Code rate | 0.89 | 0.88 | 0.86 | 0.85 |

MEMORY DEVICE WITH DIFFERENT PARITY REGIONS

CROSS-REFERENCE TO RELATED APPLICATION

The present application claims priority to Korean patent application number 10-2015-0095391, filed on Jul. 3, 2015, the entire disclosure of which is herein incorporated by reference in its entirety.

BACKGROUND

Field of Invention

Embodiments of the present disclosure relate to an electronic device, and, in particular, to a controller of a memory device and an operation method of the same.

Description of the Related Art

A semiconductor memory device may be implemented using a semiconductor such as a silicon (Si), Germanium (Ge), a gallium arsenide (GaAs), an indium phosphate (InP) or the like. The semiconductor memory device may be classified into volatile and nonvolatile memory devices.

In the volatile memory device, a power turn-off may lead to loss of stored data therein. The volatile memory device may include Static RAM (SRAM), Dynamic RAM (DRAM), Synchronous DRAM (SDRAM) and the like. In the nonvolatile memory device, despite a power turn-off, the stored data therein may be maintained. The nonvolatile memory device may include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), Ferroelectric RAM (FRAM), etc. The flash memory may be classified into NOR and NAND architectures.

SUMMARY

Various embodiments are directed to a controller for a memory device having different parity data regions for pages of a cell array, and an operation method thereof.

In one aspect of the present disclosure, there is provided a controller for a semiconductor memory device, the device including a memory cell array including a plurality of pages, the controller including a memory control module suitable for translating a logical address for data provided from a host to a physical address representing one of the plurality of pages, and determining one of a plurality of operation modes based on the physical address and pre-stored parity-related information; and an error correction code circuit suitable for generating a parity-data for the data provided from the host according to the determined operation mode.

In one implementation, the parity-related information may include information about sizes of parity-data regions. Each of the parity-data regions may correspond to one of the plurality of pages.

In one implementation, the parity-related information may include information about the plurality of operation modes. Each of the plurality operation modes may correspond to one of the plurality of pages.

In one implementation, the controller may further include a storage module suitable for storing therein the parity-related information.

In one implementation, each of the plurality of operation modes may correspond to numbers of bits of the parity-data for the one of the plurality of pages.

In one implementation, the error correction code circuit may generate the parity-data according to the determined operation mode such that the number of bits of the parity-data for each of the plurality of pages is inversely proportional to a distance of each of the plurality of pages to a drain selection line of the semiconductor memory device.

In one implementation, the memory control module may further send data to be written to the semiconductor memory device. The data to be written may include a combination of the generated parity-data and the data provided from the host.

In one aspect of the present disclosure, there is provided an operation method of a controller for a semiconductor memory device, the device including a memory cell array including a plurality of pages, the method including translating a logical address for data provided from a host to a physical address representing one of the plurality of pages; determining one of a plurality of operation modes based on the physical address and pre-stored parity-related information; and generating a parity-data for the data provided from the host according to the determined operation mode.

In one implementation, the parity-related information may include information about sizes of parity-data regions. Each of the parity-data regions may correspond to one of the plurality of pages.

In one implementation, the parity-related information may include information about the plurality of operation modes. Each of the plurality operation modes may correspond to one of the plurality of pages.

In one implementation, the plurality of operation modes may respectively correspond to numbers of bits of the parity-data for each of the plurality of pages.

In one implementation, the generating of the parity-data may be performed such that the number of bits of the parity-data for each of the plurality of pages is inversely proportional to a distance of each of the plurality of pages to a drain selection line of the semiconductor memory device.

In one implementation, the method may further include generating data to be written, wherein the data to be written includes a combination of the generated parity-data and the data provided from the host.

In one implementation, the method may further include sending the data to be written to the semiconductor memory device.

In one aspect of the present disclosure, there is provided a memory system including: a memory cell array including a plurality of pages, each of the pages connected to each of a plurality of word-lines, each of the pages including a plurality of memory cells, each of the cells having a plurality of voltage states; and a controller suitable for generating parity-data for a selected one among the plurality of the pages based on pre-stored parity-related information, and suitable for controlling the memory cell array to store data provided from a host and the generated parity-data in the selected page.

In one implementation, the parity-related information may include information about a plurality of ratios between a number of bits of the data and a number of bits of the parity-data for the plurality of pages.

In one implementation, the parity-related information may include information about sizes of parity-data regions. The parity-data regions may correspond to the plural pages, respectively.

In one implementation, the parity-related information may include information about a plurality of operation modes. Each of the plurality of operation modes may correspond to one of the plurality of pages. The plurality of operation modes may respectively correspond to numbers of bits of the parity-data for the plurality of pages.

In one implementation, the controller generates the parity-data according to the plurality of operation modes such that the number of bits of the parity-data for each of the plurality of pages is inversely proportional to a distance of each of the plurality of pages to a drain selection line of the semiconductor memory device.

In accordance with the above aspects and/or implementations, the error correction capacity may increase and thus an overall reliability of the memory device may enhance.

DETAILED DESCRIPTION

Figure 1:
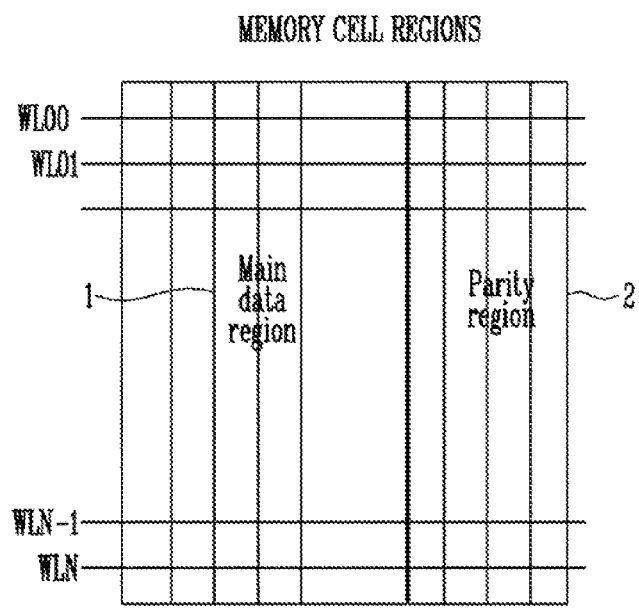
FIG. 1 illustrates memory cell regions in accordance with embodiments of the present disclosure.

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

FIG. 1 illustrates memory cell regions in accordance with embodiments of the present disclosure.

FIG. 1 schematically shows memory regions according to types of data stored therein.

Referring to FIG. 1, the memory cell regions is divided into main data region 1 and parity region 2. As used herein, the "parity" may be referred to as a "parity bit" or "parity-data".

The parity-data regions 2 may contain therein parities or parity-data to correct main data stored in the main data regions 1. Conventionally, all of parity-data regions 2 are allocated to memory cell regions connected to certain bit lines. In various examples, the memory cell regions may include data regions to store main data (e.g., payload) and spare regions to store meta-data, options, flag data, and/or the like. The parity or parity-data as mentioned herein may be stored in some portions of the spare regions.

Each of the main data regions 1 and parity-data regions 2 may include a memory cell structure to store therein data. The main data region 1 and parity-data region 2 may have the same cell structure. Thus, the division of the data region 1 and the parity-data region 2 may be according to data stored therein. That is, it is possible that the parity-data region 2 may store main data therein while the main data region may store parity-data therein.

Figure 2A:
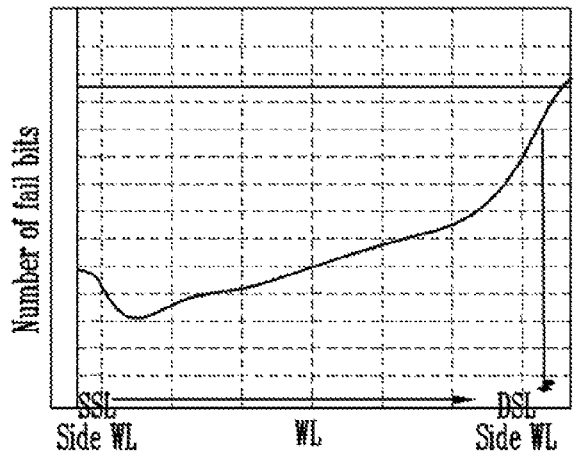
FIGS. 2A and 2B illustrate an occurrence of fail bits according to locations of word-lines.
Figure 2B:
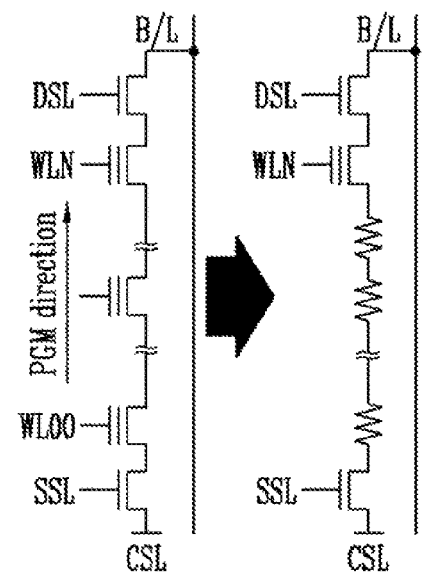

FIGS. 2A and 2B illustrate an occurrence of fall bits according to locations of word-lines.

The memory cell array includes a plurality of word-lines WL00 to WLN. Each word-line may be connected to a plurality of memory cells (or cell regions). Entire memory cells coupled to a single word-line may form a single page.

FIG. 2A is a graph illustrating a number of fail bits according to the locations of the plural word-lines when data is programmed into the plural memory cells coupled to the plural word-lines and then the programmed data is read out.

Referring to FIG. 2A, the number of fail bits may vary according to the locations of word-lines.

Assuming that each word-line is associated with the same number of parity data bits, the word-lines adjacent to a source select line (SSL) and/or drain select line (DSL) may have relatively greater number of detected fall bits. The fall bits occurrences may be more frequent about a word-line adjacent to the DSL than to the SSL. Thus, the possibility of fail bits occurrences may increase in the memory cell regions connected to the word-lines the DSL in a case of a single cell string.

FIG. 2B is a circuit diagram illustrating the single cell string (CSL) to show a reason for the trend shown in FIG. 2A.

Referring to FIG. 2B, the programming operation is performed in a direction from a zero-th word-line WL00 to a N-th word-line WLN (noted as "PGM direction" in FIG. 2B). In a case of the single cell string, the programming is carried out sequentially from the zero-th word-line WL00 to the N-th word-line WLN, and a drain of a transistor corresponding to the drain selection line (DSL) is coupled to a bit line (B/L).

Therefore, when the programming is performed to a memory cell (DSL side cell) adjacent to the drain selection line DSL, memory cells which are below the DSL side cell and previously programmed act as resistors in the single cells string. That is, from the view point of the drain selection line, the resistances of the memory cells (SSL side cells) adjacent to the source selection line SSL increase due to the "body bias effect". Thus, the memory cell coupled to the word-line adjacent to the DSL has a higher erasing threshold voltage. The higher erasing threshold voltage results in an increase of the fall bits occurrences during reading operation.

In order to solve the above described problem, the present disclosure provides a controller to control a memory device having different parity regions for plural pages since the numbers of fails bits are different according to the locations of the different word-lines. As described above, a single page includes a plurality of memory cells connected to a single word-line. In accordance with an embodiment of the present disclosure, a high fail bit page (HFBP) with a higher fail bits occurrence possibility is assigned a larger parity-data region while a low fail bit page (LFBP) with a lower fail bits occurrence possibility is assigned a smaller parity-data region. In this connection, a greater amount of parity-data may be generated for data programmed to the HFBP. This increases error correction efficiency of the HFBP. The generation of the greater amount of parity-data causes an increase in the number of fails bits to be correctable.

Figure 3:
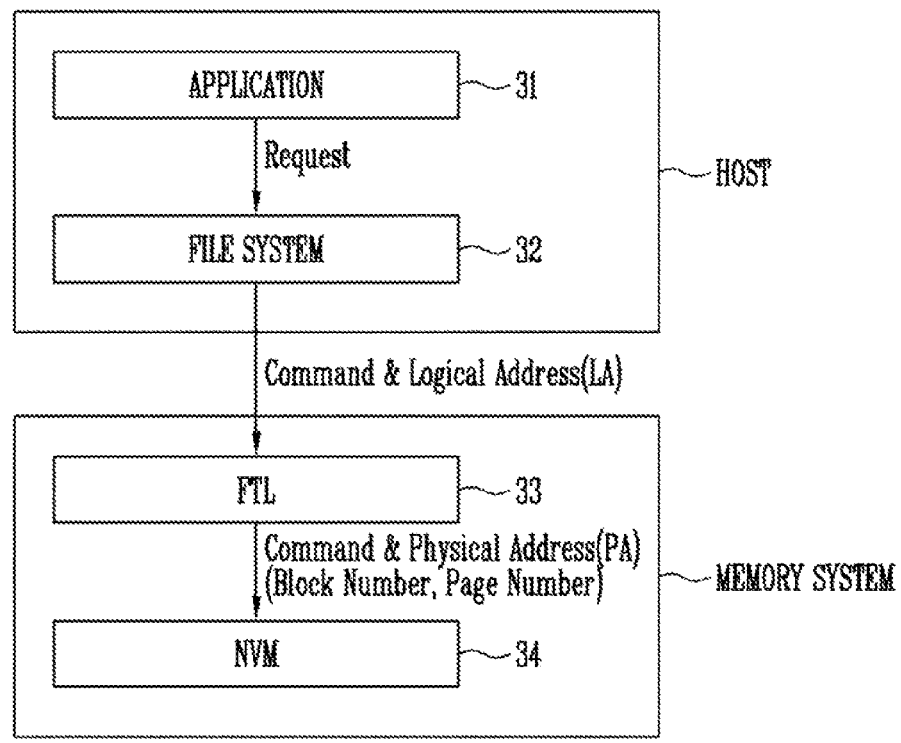
FIG. 3 illustrates operations between a host and a memory system.

FIG. 3 illustrates operations between a host and a memory system when the host programs/reads data into/from the memory system.

Referring to FIG. 3, the host includes an application 31 and a file system 32. When the application 31 makes a request, the file system 32 generates a command and a logical address (LA), and transfers them into a flash translation layer (FTL) 33.

Thereafter, the flash translation layer 33 translates the LA from the file system 32 to the physical address PA (e.g., a block number, page number, etc.), and transfers the translated PA to a nonvolatile memory device 34. The flash translation layer 33 maps the LA generated by the file system 32 to the PA of the nonvolatile memory device 34 during reading or writing operation of the nonvolatile memory device 34.

In the semiconductor memory device in the accordance with the present disclosure the HFBP may be assigned a larger parity-data region. In this connection, in order to generate a greater amount of parity-data for data to be programmed to the HFBP, an operation mode of an Error Correction Code (ECC) circuit is determined based on the PA of the memory device. The error correction code circuit increases an error correction rate of the HFBP in accordance with the determined operation mode.

Figure 4:
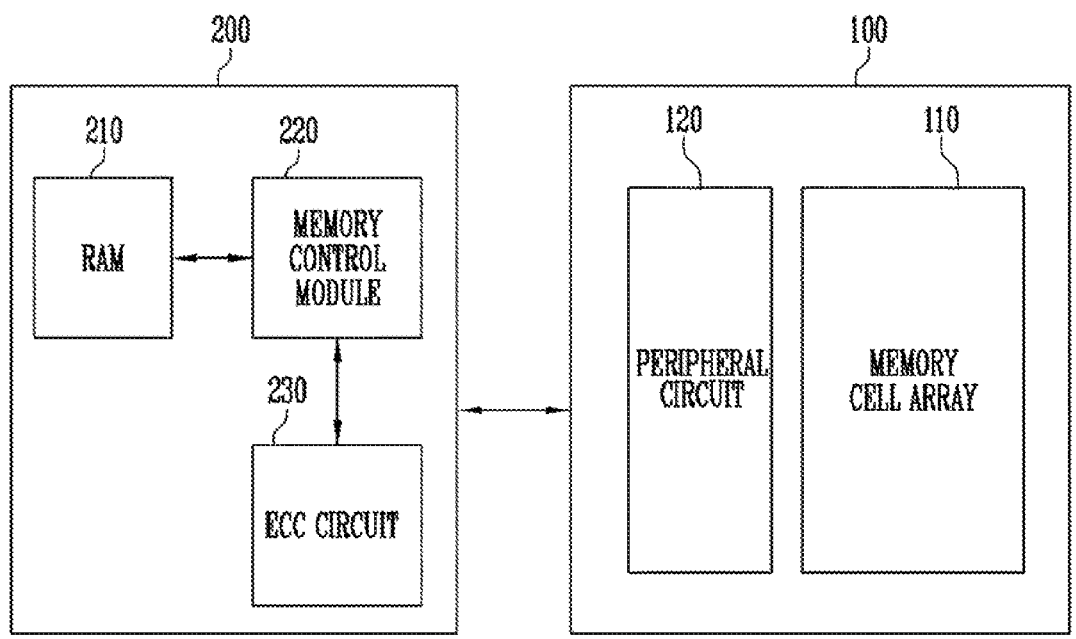
FIG. 4 illustrates a memory system including a controller for a memory device in accordance with embodiments of the present disclosure.

FIG. 4 illustrates a memory system 50 including a controller 200 for a memory device 100 in accordance with embodiments of the present disclosure.

Referring to FIG. 4, the memory system 50 includes the semiconductor memory device 100 and the controller 200.

The semiconductor memory device 100 includes a NAND flash memory, vertical NAND flash memory, NOR flash memory, resistive random access memory (RRAM), phase-change memory (PRAM), magneto-resistive random access memory (MRAM), ferroelectric random access memory (FRAM), spin transfer torque random access memory (STT-RAM), and/or other suitable memory as will be understood by one of skill in the art from the disclosure herein. Further, the semiconductor memory device 100 in accordance with the present disclosure may be implemented in a three-dimensional array structure. The present disclosure may be applied to a flash memory device where a charge storage layer is made of a conductive floating gate and to a charge trap flash (CTF) memory device where a charge storage layer is made of an insulating film.

The semiconductor memory device 100 includes a memory cell array 110 and a peripheral circuit 120 constructed to drive the memory cell array 110. The memory cell array 110 includes a plurality of nonvolatile memory cells.

The memory cell array 110 includes a plurality of memory blocks. The plurality of memory blocks may include a system block, a user block, and the like according to a usage thereof.

The peripheral circuit 120 operates under the control of the controller 200. The peripheral circuit 120 programs data into the memory cell array 110. The peripheral circuit 120 reads/cancels data from the memory cell array 110.

In various implementations, the semiconductor memory device 100 performs the read and program operations on a memory-page basis. In various implementations, the semiconductor memory device 100 performs the erase operation on a memory-block basis.

During the program operation, the peripheral circuit 120 receives from the controller 200 a command to indicate a programming operation, a physical address (PA) and data to be written. The peripheral circuit 120 programs the data in a selected page of a selected memory block indicated by the PA.

During the read operation, the peripheral circuit 120 receives from the controller 200 a command to indicate a reading operation, and a physical address (PA). The peripheral circuit 120 reads data from a selected page of a selected memory block indicated by the PA, and then outputs the read data (hereinafter, referred to as "page data") to the controller 200.

During the erase operation, the peripheral circuit 120 receives from the controller 200 a command to indicate an erasing operation and a physical address (PA). The PA may indicate a single memory block. The peripheral circuit 120 erases data from the memory block identified by the PA.

The controller 200 controls overall operations of the semiconductor memory device 100. The controller 200 accesses the semiconductor memory device 100 in response to the request from the host.

The controller 200 includes a random access memory (RAM) 210, a memory control module 220 and an error correction circuit 230.

The RAM 210 operates under the control of the memory control module 220. The RAM 210 may serve as work memory, buffer memory, cache memory, etc. When the RAM 210 serves as the work memory, the RAM temporally stores therein data processed by the memory control module 220. When the RAM 210 serves as the buffer memory, the RAM buffers data to be transferred from a host (not shown) to the semiconductor memory device 100 or vice versa. When the RAM 210 serves as the cache memory, the RAM enables a slow-rate semiconductor memory device 100 to operate in a high-rate.

The RAM 210 stores therein parity-related information for the memory cell array 110 of the semiconductor memory device 100. The parity-related information includes information about the size of a parity-data region assigned to each of the plurality of pages forming the memory cell array 110. Moreover, the parity-related information includes information about operation modes of the error correction code circuit 230 corresponding to the plurality of the pages. In various embodiments, the parity-related information is stored in a look-up table. The parity-related information defines the operation modes of the error correction code circuit 230 generating a greater number of the parity-data bits for the pages closer to the drain selection line of the memory cell array 110. Further, the operation modes of the error correction code circuit 230 are defined according to empirically-predetermined sizes of the parity-data regions of the pages.

The memory control module 220 controls the read, program, erase, and background operations of the semiconductor memory device 100. The memory control module 220 also drives a firmware to control the semiconductor memory device 100.

The memory control module 220 translates a logical address (LA) from the host to a physical address (PA) through the flash translation layer FTL. The flash translation layer (FTL) translates the received LA to the PA using a mapping table. Here, the logical address refers to a logical block address while the physical address refers to a physical page number. The address mapping scheme of the flash translation layer varies according to units of mapping. For example, the address mapping scheme may include, but not be limited to, page mapping, block mapping, and hybrid mapping methods.

When the host requests the program operation, the memory control module 220 translates the logical address from the host to the physical address through the above-exemplified address mapping scheme. Once the physical address for programming operation is mapped, the memory control module 220 determines an operation mode of the error correction code circuit 230 in accordance with the parity-related information contained in the RAM 210.

Next, the memory control module 220 transfers to the error correction code circuit 230 the data from the host and the determined operation mode of the error correction code circuit 230.

Further, when the error correction code circuit 230 generates the parity-data, adds the same to the data to be written, and sends the parity-added data to the memory control module 220, the memory control module 220 sends to the semiconductor memory device 100 a program command the data to be written and the physical address.

When the host requests the read operation, the memory control module 220 provides a read command for the semiconductor memory device 100 to identify data programmed in a selected page by the read request. The memory control module 220 provides with the semiconductor memory device 100 a physical address mapped to a logical address contained in the read request together with the read command. In various embodiments, each time receiving the request from the host, the memory control module 220 translates the logical address to the physical address through the flash translation layer. In various embodiments, the memory control module 220 stores the translated information during the program operation, and acquires a corresponding physical address from the stored translated information when receiving the read request.

Next, in response to the read command, the semiconductor memory device 100 reads page data from a selected page corresponding to the physical address, and then sends the read page data to the controller 200.

The memory control module 220 sends to the error correction code circuit 230 the page data, physical address and operation mode of the error correction code circuit 230.

The error correction code circuit 230 detects and corrects errors in the page data under the control of the memory control module 220. When the errors are detected, the error correction code circuit 230 corrects the errors using the parity-data. The error correction code circuit 230 corrects the errors using coded modulations, such as the low density parity check (LDPC) code, the Bose-Chaudhri-Hocquenghem (BCH) code, the turbo code, the Reed-Solomon code, the convolution code, the recursive systematic code (RSC), the trellis-coded modulation (TCM), the block coded modulation (BCM), the hamming code, or the like.

The error correction code circuit 230 generates parity-data as the error correction code for data to be written. Further, the error correction code circuit 230 corrects errors for the read page data using the generated parity-data.

During the program operation, the error correction code circuit 230 generates the parity bit or parity-data in accordance with the operation mode information received from the memory control module 220. In various embodiments, the error correction code circuit 230 stores therein information on a number of parity bits to be generated in accordance with the operation modes. Further, the error correction code circuit 230 generates the parity bits-combined data.

The error correction code circuit 230 has a plurality of the operation modes, and generates a different number of parity bits through each of the plurality of operation modes. Furthermore, the error correction code circuit 230 generates a plurality of data to be written through each of the plural operation mode with different ratios between a number of the data bits to be written and a number of the parity-data bits.

In various embodiments, the error correction code circuit 230 divides data to be programmed into a plurality of chunk-units and generates each parity-data for each chunk-unit data. Further, the error correction code circuit 230 generates the parity-data for all of data to be programmed.

In various implementations, the correction code circuit 230 combines the generated parity-data to data to be programmed to generate data to be written. The error correction code circuit 230 sends the generated data to be written to the memory control module 220.

During the read operation, the error correction code circuit 230 detects and corrects errors of the read page data. At this time, a number of correctable error bits depends on the operation mode in which the error correction code circuit 230 operates during the program operation.

Generally, an increase in a number of parity bits leads to an increase in a number of correctable error bits. Thus, the page data with a greater number of parity bits may have a greater number of correctable error bits. An inclusion of a number of error bits greater than a predetermined number in a page data leads to a decoding failure of the page data. To the contrary, an inclusion of a number of error bits equal to or less than the predetermined number in the page data leads to a decoding success of the page data.

The decoding success refer to a pass of a corresponding read command. To the contrary, the decoding failure refers to a fail of a corresponding read command. In a case of the decoding success, the controller 200 outputs page data with corrected errors to the host.

Figure 5:
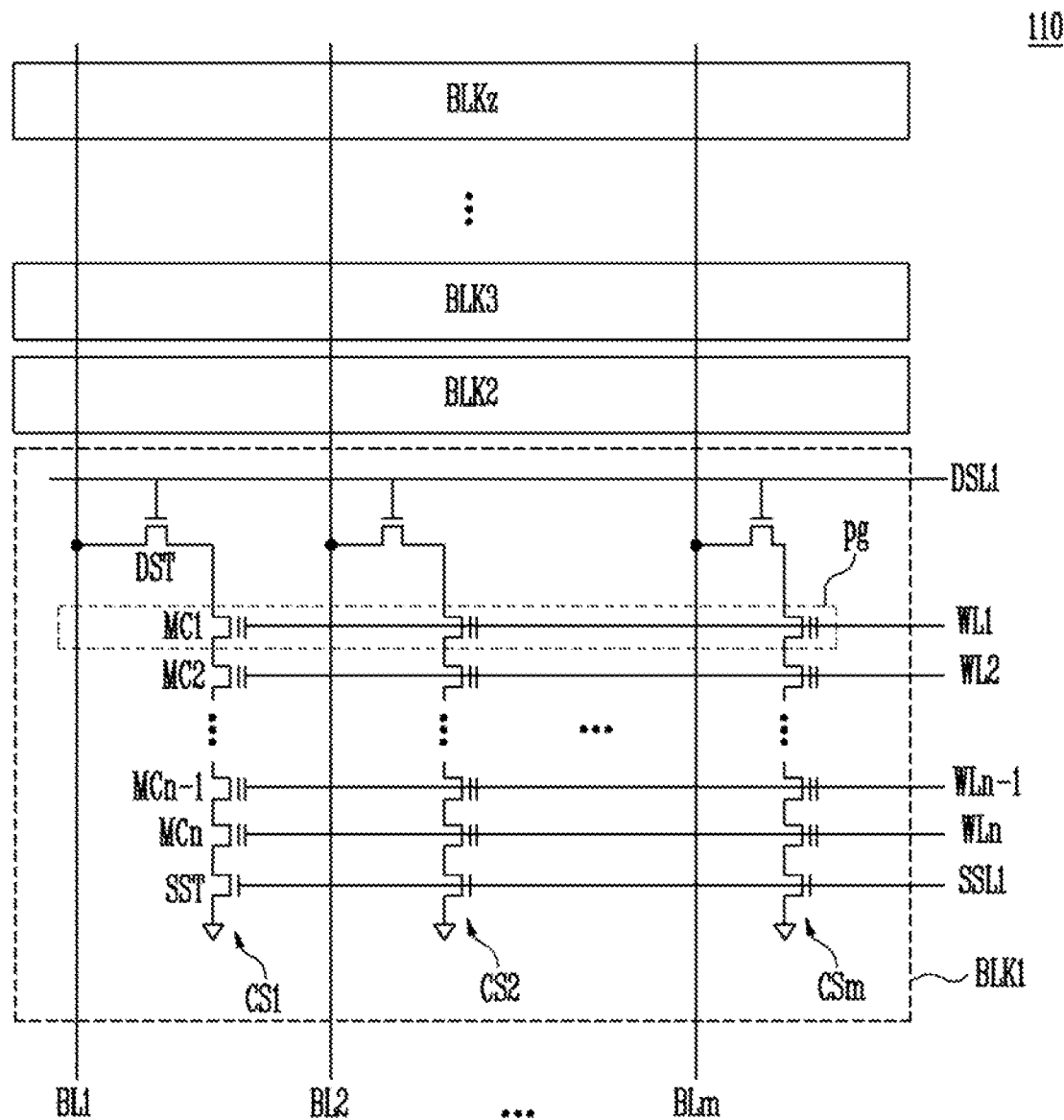
FIG. 5 illustrates a memory cell array.

FIG. 5 illustrates the memory cell array 110 shown in FIG. 4.

Referring to FIG. 5, the memory cell array 110 includes a plurality of memory blocks BLK1 to BLKz. The first to z-th memory blocks BLK1 to BLKz are connected to each of the first to m-th bits lines BL1 to BLm. The first to m-th bits lines BL1 to BLm form the bits lines (BL) as in FIG. 2. Each of the plurality of the memory blocks BLK1 to BLKz define an erasing unit.

Referring to FIG. 5, elements contained in one BLK1 from among the plurality of memory blocks BLK1 to BLKz are shown and elements in each of other memory blocks BLK2 to BLKz are omitted. Each of other memory blocks BLK2 to BLKz may have the same configuration as that of the first memory block BLK1.

The memory block BLK1 includes plurality of cell strings CS1 to CSm. The first to m-th cell strings CS1 to CSm are respectively connected to the first to m-th bits lines BL1 to BLm.

Each of the plurality of the cell strings CS1 to CSm has a drain selection transistor DST, a plurality of memory cells MC1 to MCn connected in series to each other, and a source selection transistor SST. The drain selection transistor DST is connected to a first drain selection line DSL1. The first to n-th memory cells MC1 to MCn are respectively connected to first to n-th word-lines WL1 to WLn. The source selection transistor SST is connected to a first source selection line SSL1.

A drain of the drain selection transistor DST is connected to a corresponding bit line. A source of the source selection transistor SST is connected to a reference voltage node. In one example, the source of the source selection transistor SST is connected to a common source line (not shown), which, in turn, is biased to a reference voltage.

All of memory cells respectively coming from among the first to m-th cell strings CS1 to CSm and collectively connected to a single word-line (e.g., WL1) form a single page (pg). Thus, a single memory block BLK1 contains a plurality of pages.

The first drain selection line (DSL1), the first to n-th word-lines WL1 to WLn and the first source selection line (SSL1) are included in row lines (RLs) in FIG. 2. The first drain selection line (DSL1), the first to n-th word-lines WL1 to WLn and the first source selection line (SSL1) are controlled by an address decoder in the peripheral circuit 120. The first to m-th bits lines BL1 to BLm are controlled by a read and write circuit in the peripheral circuit 120.

Figures 6, 7:
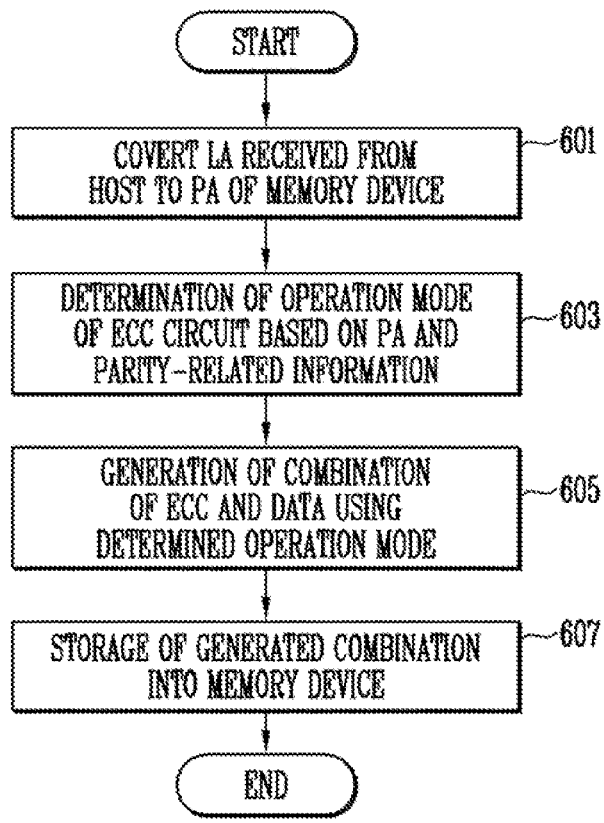
FIG. 6 illustrates an operation of a controller for a memory device in accordance with the present disclosure.
FIG. 7 illustrates an example of parity-related information stored in a controller for a memory device in accordance with the present disclosure.

FIG. 6 illustrates an operation of the controller 200 for the memory device.

FIG. 6 shows the program operation in accordance with the present disclosure.

Referring to FIGS. 4 and 6, the controller 200 receives a program request from a host. The controller 200 receives from the host data and associated logical address (LA) to be programmed in addition to the program request. The controller translates the LA from the host to a physical address (PA) of the memory device at step 601. Using a flash translation layer (FTL), the controller 200 translates the logical address to the physical address. The flash translation layer (FTL) uses a mapping table between the logical address and physical address. The flash translation layer (FTL) is loaded on the RAM in the controller 200.

At step 603, the controller 200 determines the operation mode of the error correction code circuit 230 based on the translated physical address and parity-related information stored in the RAM in the controller 200. The parity-related information may include a size of a parity-data region assigned to each of the plurality of pages forming the memory cell array 110. Moreover, the parity-related information may include information about operation modes of the error correction code circuit 230 respectively corresponding to the plurality of the pages. In various embodiments, the parity-related information may be stored in a look-up table. The parity-related information defines the operation modes of the error correction code circuit 230 generating greater number of the parity-data bits for the pages closer to the drain selection line of the memory cell array 110. Further, the operation modes of the error correction code circuit 230 may be defined according to empirically-predetermined sizes of the parity-data regions of the pages.

The controller 200 generates parity data as the error correction code for data to be programmed using the operation mode of the error correction code circuit 230 determined in step 603. In various embodiments, the error correction code circuit 230 stores therein information on the numbers of the parity bits to be generated based on the operation modes. Further, the error correction code circuit 230 generates the parity bits-combined data. The error correction code circuit 230 has a plurality of the operation modes, and generates a different number of parity bits through each of the plural operation modes. Furthermore, the error correction code circuit 230 generates a plurality of data to be written through each of the plural operation modes with different ratios between a number of the data bits to be written and a number of the parity-data bits.

In various embodiments, the error correction code circuit 230 divides data to be programmed into a plurality of chunk-units and generates each parity-data for each chunk-unit data. Further, the error correction code circuit 230 generates the parity-data for all of data to be programmed.

The correction code circuit 230 combines the generated parity-data to data to be programmed to generate data to be written at step 605.

At step 607, the controller 200 sends the data to be written, physical address and the program command to the semiconductor memory device 100 which in turn may store therein data based on the same.

A method of carrying out the read operation of the programmed data is described below with reference to FIG. 6.

The controller 200 provides a read command for the semiconductor memory device 100 to identify data programmed in a selected page by the read command. The controller 200 provides with the semiconductor memory device 100 a physical address mapped to a logical address contained in the read command together with the read command. In various embodiments, each time receiving the request from the host, the controller 200 translates the logical address to the physical address through the flash translation layer. In various embodiments, the controller 200 stores the translated information during the programming operation, and acquires a corresponding physical address from the stored translated information when receiving the read request.

The controller 200 detects and corrects errors in the page data. When the errors are detected, the error correction code circuit 230 corrects the errors using the parity-data. The error correction code circuit 230 corrects the errors using coded modulations, such as the low density parity check (LDPC) code, the Bose-Chaudhri-Hocquenghem (BCH) code, the turbo code, the Reed-Solomon code, the convolution code, the recursive systematic code (RSC), the trellis-coded modulation (TCM), the block coded modulation (BCM), the hamming code, or the like. At this time, a number of correctable error bits depends on the operation mode in which the error correction code circuit 230 operates during the program operation.

Generally, an increase in a number of parity bits leads to an increase in a number of correctable error bits. Thus, the page data with a greater number of parity bits may have a greater number of correctable error bits. An inclusion of a number of error bits greater than a predetermined number in a page data leads to a decoding failure of the page data. To the contrary, an inclusion of a number of error bits equal to or less than the predetermined number in the page data leads to a decoding success of the page data.

The decoding success refers to a pass of a corresponding read command. To the contrary, the decoding failure refers to a fail of a corresponding read command. In a case of the decoding success, the controller 200 outputs page data with corrected errors to the host.

FIG. 7 is an example of parity-related information stored in the controller for the memory device in accordance with the present disclosure.

Referring to FIG. 7, the parity-related information includes information about the size of the parity-data region assigned to each of the plurality of pages forming the memory cell array 110. Moreover, the parity-related information includes information about the operation modes of the error correction code circuit 230 corresponding to the plurality of the pages. In various embodiments, the parity-related information is stored in a look-up table. The parity-related information defines the operation modes of the error correction code circuit 230 generating greater number of the parity-data bits for the pages closer to the drain selection line of the memory cell array 110. Further, the operation modes of the error correction code circuit 230 are defined according to empirically-predetermined sizes of the parity-data regions of the pages.

FIG. 7 shows parity-related information such as maximum numbers of fail bits, added numbers of parity bits, added sizes of parity-data regions and code rates according to the operation modes of the error correction code circuit 230. For example, each of the operation modes may be as follows:

a first mode (mode 1): a default mode in which any portion of the data region does not serve as the parity-data region;

a second mode (mode 2): a portion of the data region serves as the parity-data region, and a number of correctable error bits extends to 80 bits;

a third mode (mode 3): a portion of the data region serves as the parity-data region, the employed portion being larger than that in the mode 2, and a number of correctable error bits extends to 90 bits; and a fourth mode (mode 4): a portion of the data region serves as the parity-data region, the employed portion being larger than those in the mode 2 or the mode 3, and a number of correctable error bits extends to 100 bits.

Change of the operation mode from the first mode to the fourth mode leads to an increase in a number of parity bits, and hence in error correction capacity. Further, the sizes of parity-data region added for the parity data is configured such that the second, third and fourth may correspond respectively to 17.5, 35, and 52.5 bytes. Such dimensions occupy less than 0.1% of the entire main data region, and thus be negligible in affecting a storage performance of the memory device. It should be noted that although FIG. 7 exemplarily shows only the first to fourth modes, there may be more operation modes depending on setting methods.

Figure 8:
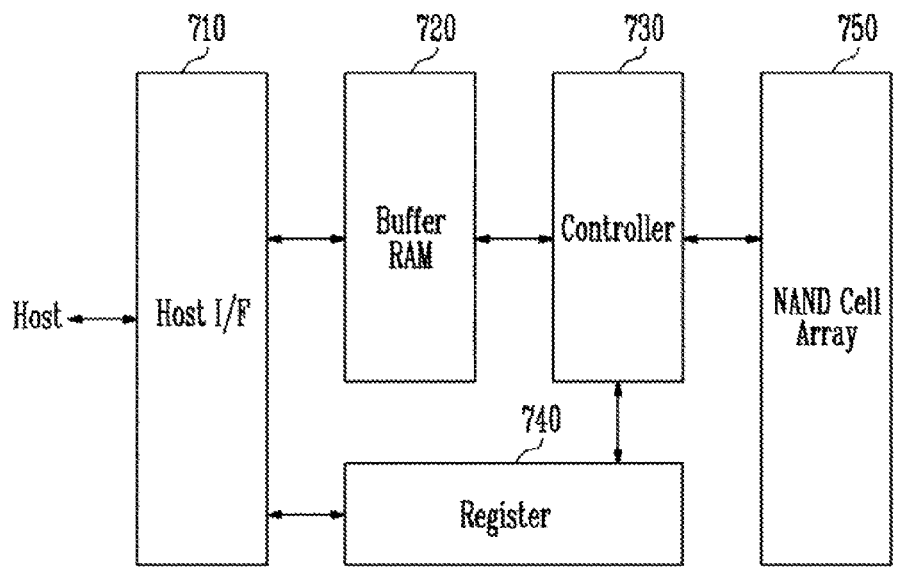
FIG. 8 illustrates a memory system including a controller for a memory device in accordance with the present disclosure.

FIG. 8 illustrates a memory system including the controller for the memory device in accordance with the present disclosure. For example, the features of the present disclosure may be applied to the fusion memory device 700 as in FIG. 8.

The flash memory device 700 includes a host interface 710, buffer RAM 720, controller 730, register 740 and NAND flash cell array 750. The interface 710 communicates a variety of information with other devices using different protocols. The buffer RAM 720 temporally stores data or contain codes to drive the memory device. The controller 730 controls reading, programming and states in response to control signals and instructions from an external source. The register 740 stores, for example, instructions, addresses and/or configuration data to define an internal system operation environment in the memory device. The NAND flash cell array 750 is configured as an operation circuit including nonvolatile memory cells and page buffers. In response to a writing request, the flash memory device programs data in above-mentioned manner.

The NAND flash cell array 750 in FIG. 8 may correspond to the memory cell array 110 in FIG. 4. The peripheral circuit 120, memory control module 220, RAM 210 and error correction code circuit 230 in FIG. 4 may be included in the controller 730.

Figure 9:
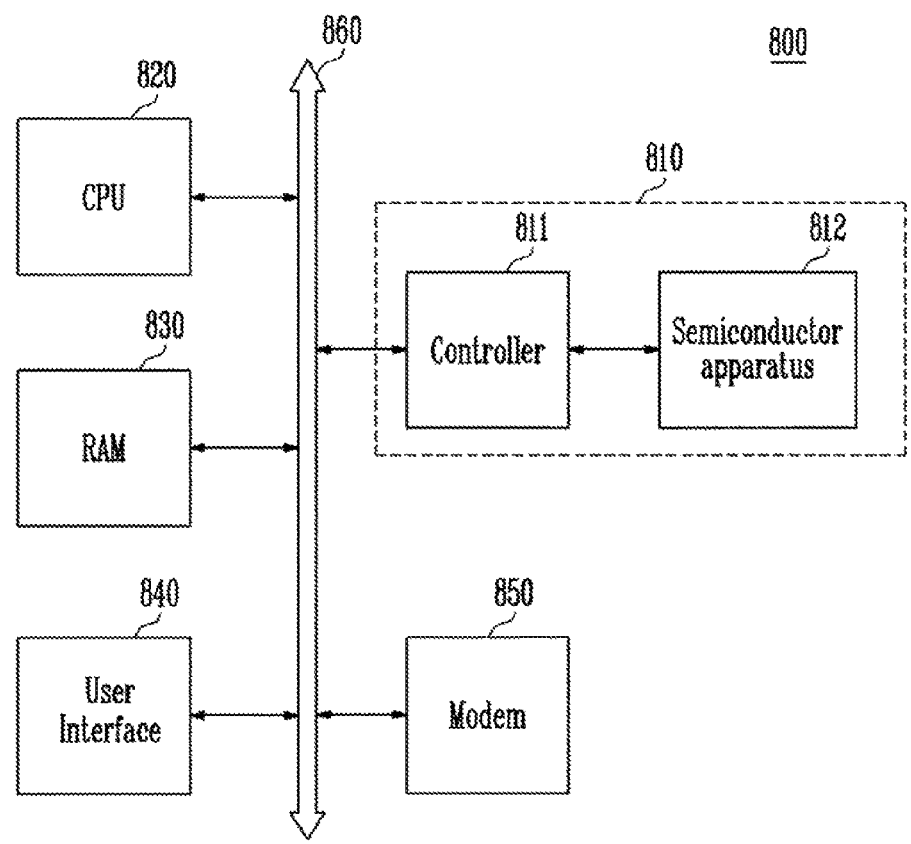
FIG. 9 illustrates a computing system including a memory system including a controller for a memory device in accordance with the present disclosure.

FIG. 9 illustrates a computing system including the memory system including the controller for the memory device in accordance with the present disclosure.

Referring to FIG. 9, the computing system 800 in accordance with the present disclosure includes a microprocessor 820, RAM 830, user interface 840, modem 850 such as a baseband chipset and memory system 810, all of which are electrically interconnected via a system bus 860. A memory system 810 has a controller 811 and a semiconductor device 812 which may correspond respectively to the controller 200 and semiconductor memory device 100 in accordance with the present disclosure as shown in FIG. 4. When the computing system 800 in accordance with the present disclosure may be a mobile device, the computing system 800 may additionally include a battery (not shown) to provide an operation voltage thereof. Although not shown in the figure, the computing system 800 in accordance with the present disclosure may be further provided with an application chipset, camera image processor (CIS), mobile DRAM, etc., as one of skill in the art would understand from the disclosure herein. As an example, The memory system 810 may configure a Solid State Drive/Disk (SSD) using a nonvolatile memory to store data therein. Moreover, the memory system 810 may be provided as a fusion flash memory.

Figure 10:
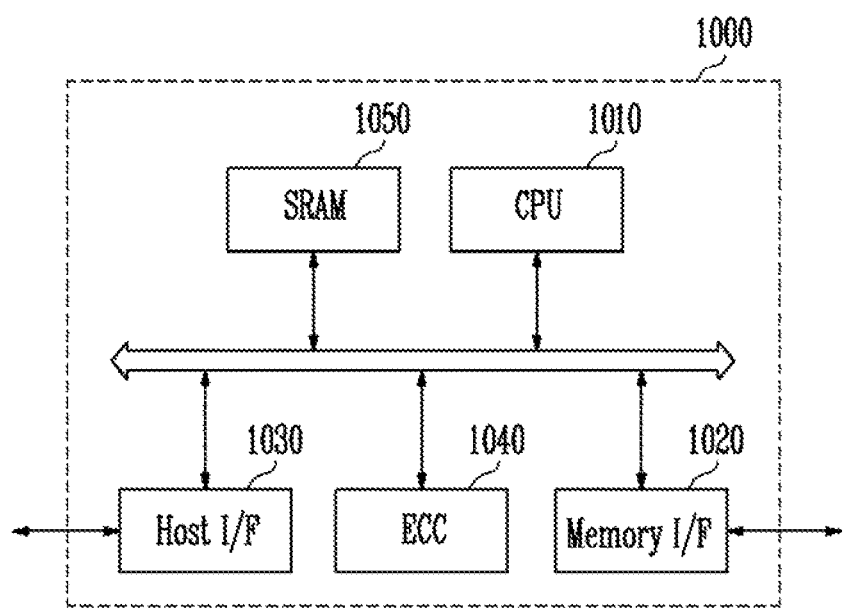
FIG. 10 illustrates a memory device controller in accordance with the present disclosure.

FIG. 10 illustrates a memory device controller in accordance with the present disclosure.

In the memory system 50 as shown in FIG. 4, the semiconductor memory device 100 and the controller 200 may be combined to be implemented as a memory card or semiconductor disk device (Solid State Disk: SSD).

Referring to FIG. 10, the controller 1000 includes SRAM 1050, processing unit 1010, host interface 1030, error correction block 1040 and memory interface 1020. The combination of the processing unit 1010 and SRAM 1050 as shown in FIG. 10 may serve as the memory control module 220 as shown in FIG. 4, and the error correction block 1040 may correspond to the error correction code circuit 230 of the controller 200 as shown in FIG. 4. The SRAM 1050 may be used as an operation memory for the processing unit 1010. In various embodiments, the SRAM 1050 may be included in the memory control module 220 or may be implemented in a separate RAM 210 as shown in FIG. 4.

The host (system) interface 1030 has a data exchange protocol of a host (system) connected to the memory system 50. The error correction block 1040 detects and corrects errors contained in data read from the semiconductor device 110. The memory interface 1020 interfaces with the semiconductor memory device 100 according to the present disclosure. The processing unit 1010 executes overall control operations of the controller 200 to exchange data. The host (not shown) and controller 1000 are connected to each other via various interfaces. For instance, the host interface 1030 may include standard interfaces such as PATA (parallel Advanced Technology Attachment), SATA (serial Advanced Technology Attachment), SCSI (Small Computer Small Interface), SAS (Serial Attached SCSI), USB (Universal Serial Bus), PCIe (PCI express) and the like.

The memory system 50 may be further provided with a ROM (not shown) to store code data to interface with the host or host. The semiconductor memory device 100 may be implemented as a multi-chip package divided to a plurality of flash memory chips. The above memory system 50 according to the present disclosure may be provided as a high reliability storage medium with a lower error occurrence. A memory system such as a semiconductor disk device (Solid State Disk: SSD) subjected to a recent research focus may be provided with the semiconductor device according to the present disclosure.

Although the present disclosure has been described with reference to limited embodiments and drawings, the present disclosure is not limited thereto. The present disclosure may encompass variations and modifications thereto via the skilled person to the art.

Therefore, a scope of the present disclosure may not be limited to the embodiments as described above, but, rather, may be defined by following claims and their equivalents.

If desired, the different functions discussed herein may be performed in a different order and/or concurrently with each other. Furthermore, if desired, one or more of the above-described functions may be optional or may be combined. Although various aspects of the embodiments are set out in the independent claims, other aspects comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present disclosure as defined in the appended claims.

What is claimed is:

1. A controller for a semiconductor memory device, the device including a memory cell array including a plurality of pages, the controller comprising:
a memory control module configured to translate a logical address for data provided from a host, to a physical address representing one of the plurality of pages, and to determine one of a plurality of operation modes based on the physical address and pre-stored parity-related information; and
an error correction code circuit configured to generate parity-data for the data provided from the host according to the one of a plurality of operation modes,
wherein the plurality of operation modes determine a number of bits of the parity-data for the one of the plurality of pages,
wherein the plurality of operation modes are defined to generate more bits of the parity-data for the one of the plurality of pages which is adjacent to a selection line of the memory cell array,
wherein the plurality of operation modes respectively correspond to the number of bits of the parity-data for each of the plurality of pages, and
wherein the error correction code circuit generates the parity-data according to the determined operation mode such that the number of bits of the parity-data for each of the plurality of pages is inversely proportional to a distance of each of the plurality of pages to a drain selection line of the memory cell array.

2. The controller of claim 1,
wherein the parity-related information includes information about sizes of parity-data regions, and
wherein each of the parity-data regions corresponds to one of the plurality of pages.

3. The controller of claim 1,
wherein the parity-related information includes information about the plurality of operation modes, and
wherein each of the plurality of operation modes corresponds to one of the plurality of pages.

4. The controller of claim 1, further comprising a storage module configured to store therein the parity-related information.

5. The controller of claim 1,
wherein the memory control module further sends data to be written to the semiconductor memory device, and wherein the data to be written includes a combination of the generated parity-data and the data provided from the host.

6. An operation method for a controller of a semiconductor memory device, the device including a memory cell array including a plurality of pages, the method comprising:

translating a logical address for data provided from a host to a physical address representing one of the plurality of pages;

determining one of a plurality of operation modes based on the physical address and pre-stored parity-related information; and generating parity-data for the data provided from the host according to the one of the plurality of operation modes, wherein the plurality of operation modes determine a number of bits of the parity-data for the one of the plurality of pages, wherein the plurality of operation modes are defined to generate more bits of the parity-data for the one of the plurality of pages which is adjacent to a selection line of the memory cell array, wherein each of the plurality of operation modes corresponds to the number of bits of the parity-data for one of the plurality of pages, and wherein the generating of the parity-data is performed such that the number of bits of the parity-data for each of the plurality of pages is inversely proportional to a distance of each of the plurality of pages to a drain selection line of the memory cell array.

7. The method of claim 6,
wherein the parity-related information includes information about sizes of parity-data regions, and
wherein each of the parity-data regions corresponds to one of the plurality of pages.

8. The method of claim 6,
wherein the parity-related information includes information about the plurality of operation modes, and
wherein each of the plurality of operation modes corresponds to one of the plurality of pages.

9. The method of claim 6,
further comprising generating data to be written,
wherein the data to be written includes a combination of the generated parity-data and the data provided from the host.

10. The method of claim 9, further comprising sending the data to be written to the semiconductor memory device.

11. A memory system comprising:

a memory cell array including a plurality of pages, each of the pages connected to each of a plurality of wordlines, each of the pages including a plurality of memory cells, each of the cells having a plurality of voltage states; and a controller configured to generate parity-data for a selected one of the plurality of the pages based on pre-stored parity-related information, and to control the memory cell array to store data provided from a host and the generated parity-data in the selected page, wherein the controller generates more bits of the parity-data for the selected one of the plurality of pages which is adjacent to a selection line of the memory cell array, wherein the parity-related information includes information about a plurality of operation modes, wherein each of the plurality of operation modes corresponds to one of the plurality of pages, wherein each of the plurality of operation modes corresponds to a number of bits of the parity-data for one of the plurality of pages, and wherein the controller generates the parity-data according to the plurality of operation modes such that the number of bits of the parity-data for each of the plurality of pages is inversely proportional to a distance of each of the plurality of pages to a drain selection line of the semiconductor memory device.

12. The system of claim 11, wherein the parity-related information includes information about a plurality of ratios between a number of bits of the data and the number of bits of the parity-data for one of the plurality of pages.

13. The system of claim 11,
wherein the parity-related information includes information about sizes of parity-data regions, and
wherein the parity-data regions correspond to the plural pages, respectively.

* * * * *